United States Patent
Lin et al.

(10) Patent No.: US 11,982,853 B2
(45) Date of Patent: May 14, 2024

(54) OPTOELECTRONIC PACKAGE AND METHOD OF MANUFACTURING THE SAME

(71) Applicant: Advanced Semiconductor Engineering, Inc., Kaohsiung (TW)

(72) Inventors: Jr-Wei Lin, Kaohsiung (TW); Mei-Ju Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/492,495

(22) Filed: Oct. 1, 2021

(65) Prior Publication Data
US 2023/0103713 A1   Apr. 6, 2023

(51) Int. Cl.
*G02B 6/42* (2006.01)
*G02B 6/43* (2006.01)

(52) U.S. Cl.
CPC ............ *G02B 6/43* (2013.01); *G02B 6/4227* (2013.01); *G02B 6/4239* (2013.01)

(58) Field of Classification Search
CPC ................ G02B 6/4274; G02B 6/43; H05K 2201/10121; H05K 1/0274; H01L 25/167
See application file for complete search history.

(56) References Cited

U.S. PATENT DOCUMENTS

| | | | |
|---|---|---|---|
| 9,761,571 B2* | 9/2017 | Scanlan | H01L 23/3128 |
| 10,720,417 B2 | 7/2020 | Scanlan | |
| 10,823,921 B2* | 11/2020 | Islam | G02B 6/4269 |
| 10,872,854 B2 | 12/2020 | Raghunathan et al. | |
| 2021/0050327 A1 | 2/2021 | Shih | |
| 2023/0101340 A1* | 3/2023 | Hosseini | H01L 24/73 257/777 |

FOREIGN PATENT DOCUMENTS

WO   WO-2021176095 A1 *   9/2021   .......... G02B 6/4274

* cited by examiner

*Primary Examiner* — Omar R Rojas
(74) *Attorney, Agent, or Firm* — FOLEY & LARDNER LLP

(57) ABSTRACT

An optoelectronic package and a method of manufacturing an optoelectronic package are provided. The optoelectronic package includes a carrier. The carrier includes a first region and a second region. The first region is configured to supply power to a processing unit disposed on the carrier. The second region is for accommodating at least one optoelectronic device electrically coupled to the processing unit.

12 Claims, 11 Drawing Sheets

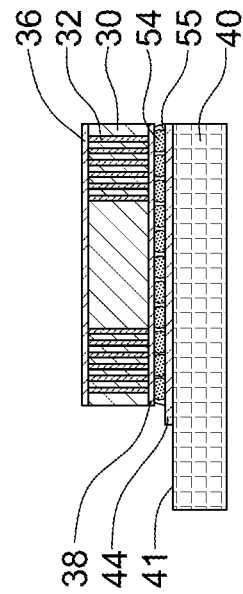
FIG. 4C
FIG. 4D
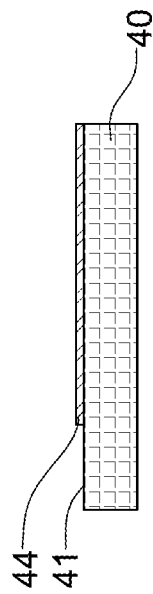
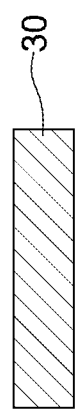
FIG. 4A
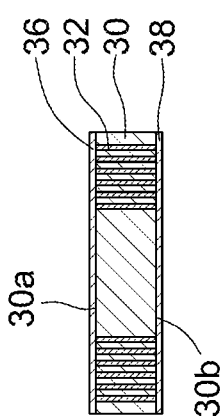
FIG. 4B

OPTOELECTRONIC PACKAGE AND METHOD OF MANUFACTURING THE SAME

BACKGROUND

1. Technical Field

The present disclosure relates generally to an optoelectronic package and a method of manufacturing an optoelectronic package.

2. Description of the Related Art

Currently, an optoelectronic package may include an application specific integrated circuit and (ASIC) and an optoelectronic device arranged in a horizontal direction on a printed circuit board (PCB). The optoelectronic device may include an electronic IC (EIC) and a photonic IC (PIC) and may be electrically to the ASIC using the PCB. A substrate or an interposer may be disposed between the ASIC and PCB. However, given that the optoelectronic device and the ASIC are arranged in a horizontal direction, a relatively large device area is required, which may result in decreased yield. In addition, electrical connection using the PCB may raise additional issues due to the relatively long electrical path between the ASIC and the optoelectronic devices.

SUMMARY

In some arrangements, an optoelectronic package includes a carrier. The carrier includes a first region and a second region. The first region is configured to supply power to a processing unit disposed on the carrier. The second region is for accommodating at least one optoelectronic device electrically coupled to the processing unit.

In some arrangements, an optoelectronic package includes a processing unit and a substrate. The substrate includes a first portion configured to supply power to the processing unit on the first portion and a second portion accommodating at least one optoelectronic device coupled to the processing unit. The second portion is recessed from an elevation of a top surface of the first portion.

In some arrangements, an optoelectronic package includes a substrate, a processing unit, and at least one optoelectronic component. The substrate includes a cavity recessed from an upper surface of the substrate. The processing unit is electrically connected to the upper surface of the substrate. The at least one optoelectronic component is disposed in the cavity of the substrate.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 4A, FIG. 4B, FIG. 4C, FIG. 4D, FIG. 4E, FIG. 4F, FIG. 4G, and FIG. 4H illustrate various operations in a method of manufacturing an optoelectronic package in accordance with some arrangements of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
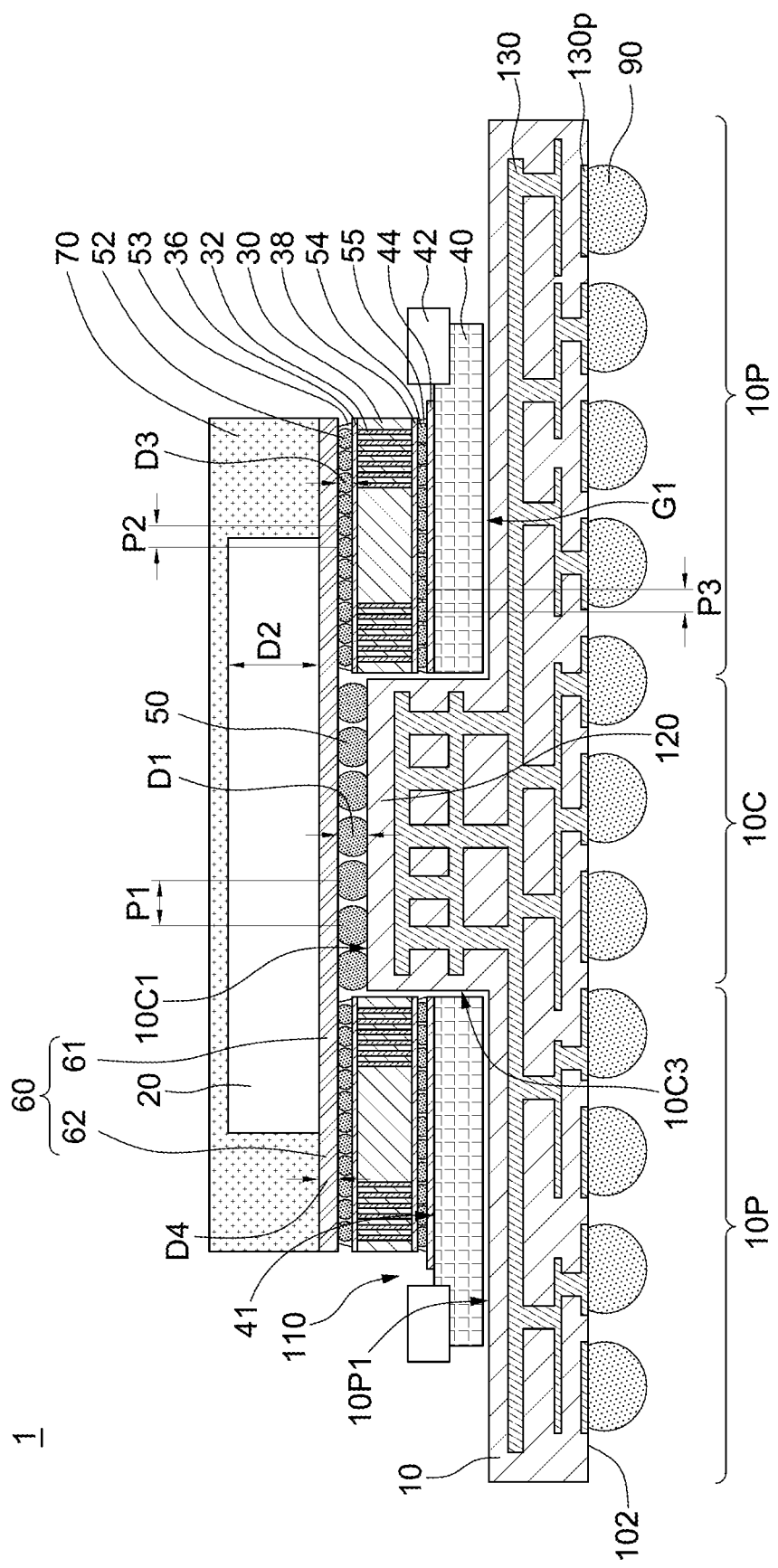
FIG. 1 illustrates a cross-sectional view of an optoelectronic package in accordance with some arrangements of the present disclosure.

FIG. 1 illustrates a cross-sectional view of an optoelectronic package 1 in accordance with some arrangements of the present disclosure. The optoelectronic package 1 includes a carrier 10, a processing unit 20, optoelectronic devices 30 and 40, optical components 42, conductive elements 50, 52 and 54, redistribution layers (RDL) 60, underfills 53 and 55, an encapsulant 70, and electrical contacts 90.

The carrier 10 includes a region 10C and a region 10P (e.g., two regions 10P are shown in FIG. 1). In some arrangements, the region 10C is a central region of the carrier 10, and the region 10P is a peripheral region of the carrier 10. As shown, the region 10C is between two regions 10P. In some arrangements, the region 10C is connected to a power supply path. In some arrangements, the power supply path is without through silicon vias (TSVs). In some arrangements, the region 10C is configured to supply power to the processing unit 20 disposed on the carrier 10. In some arrangements, the region 10P is configured to accommodate the optoelectronic devices 30 and 40 electrically coupled to the processing unit 20. In some arrangements, an elevation of an upper surface 10C1 of the region 10C of the carrier 10 is higher than an elevation of an upper surface 10P1 of the region 10P of the carrier 10. An elevation of a surface is defined as a distance between said surface and a bottom surface 102 of the carrier 10 in a direction normal to the bottom surface 102.

In some arrangements, the carrier 10 includes a cavity 110 (or a cut-away) recessed from an upper surface (i.e., the surface 10C1) of the carrier 10. In some arrangements, the cavity is located at the region 10P, such that an upper surface 10P1 of the region 10P faces the cavity 110. In some arrangements, the upper surface 10C1 is at the region 10C of the carrier 10. The upper surface 10C1 is a surface of the carrier 10 opposite to the bottom surface 102, and faces a direction opposite to the direction in which the bottom surface 102 faces. In some arrangements, the region 10C of the carrier 10 includes a protrusion portion 120. In some arrangements, due to the cavity 110, the portion 10P appears to be recessed from or lower than the elevation of the upper surface 10C1 of the protrusion portion 120. In some arrangements, the protrusion portion 120 is at the region 10C (i.e., the central region), and the cavity 110 is at the region 10P (i.e., the peripheral region). As shown in FIG. 1, the region 10C (e.g., the protrusion portion 120) is between two cavities 110. In some arrangements, the protrusion portion 120 is free from TSVs. In some arrangements, the carrier 10 is free from TSVs. In some arrangements, a lateral surface 10C3 of the protrusion portion 120 and the upper surface 10P1 of the region 10P of the carrier 10 collectively define a cavity 110.

The carrier 10 may include an interconnection structure 130. The interconnection structure 130 may include a plurality of conductive traces and/or conductive through vias. The carrier 10 may include one or more conductive pads (not shown) in proximity to, adjacent to, embedded in, and/or exposed from the upper surface 10C1 of the carrier 10. In some arrangements, the carrier 10 may include one or more conductive pads (not shown) in proximity to, adjacent to, embedded in, and/or exposed from the upper surface 10P1 of the carrier 10. The carrier 10 may include one or more conductive pads 130p in proximity to, adjacent to, embedded in, and/or exposed from a bottom surface 102 of the carrier 10. The carrier 10 may include a solder resist (not shown) on the bottom surface 102 of the carrier 10 to fully expose or to expose at least a portion of the conductive pads 130p for electrical connections. The carrier 10 may be, for example, a PCB, a paper-based copper foil laminate, a composite copper foil laminate, or a polymer-impregnated glass-fiber-based copper foil laminate. The carrier 10 may include a substrate, such as an organic substrate or a leadframe. The carrier 10 may include a two-layer or multi-layer substrate that includes a core layer and a conductive material and/or structure disposed on an upper surface and a bottom surface of the carrier 10.

The processing unit 20 may be electrically connected to the upper surface 10C1 of the carrier 10. In some arrangements, the processing unit 20 is electrically connected to the carrier 10 using an interconnection element (e.g., including the conductive elements 50 and the RDL 60). For example, each region 10P is electrically coupled to the processing unit 20 using the interconnection element. In some arrangements, the processing unit 20 is electrically connected to the upper surface 10C1 of the carrier 10 using an interconnection element (e.g., including the conductive element 50 and the RDL 60). In some arrangements, a thickness of the interconnection element (e.g., a sum of a thickness D1 of the conductive element 50 and a thickness D4 of the RDL 60) is less than a thickness D2 of the processing unit 20. The thickness D1, D2, D3, and D4 are determined along axes normal to one or more of a surface of the conductive element RDL 60 or the upper surface 10C1. In some arrangements, the processing unit 20 is electrically connected to the carrier 10 using a power supply path connected to the region 10C of the carrier 10. In some arrangements, the power supply path from the carrier 10 to the processing unit 20 includes or passes through the conductive element 50 and the RDL 60. In some arrangements, the power supply path from the carrier 10 to the processing unit 20 is free from TSVs. In some arrangements, the power supply path from the carrier 10 to the processing unit 20 including or passing through the conductive element 50 and the RDL 60 is free from TSVs. In some arrangements, a portion of the power supply path is in the protrusion portion 120 of the carrier 10. For example, a portion of the power supply path may pass through a portion of the interconnection structure 130 in the protrusion portion 120 of the carrier 10. The processing unit 20 may include a central processing unit (CPU), a microcontroller unit (MCU), a graphics processing unit (GPU), an application-specific integrated circuit (ASIC) (e.g., a switch ASIC), a storage element (e.g., a SRAM), or a combination thereof.

The optoelectronic device 30 may be disposed on the carrier 10 and in proximity to the protrusion portion 120 of the carrier 10. In some arrangements, the optoelectronic device 30 is disposed in the cavity 110 of the carrier 10. In some arrangements, a lateral surface of the optoelectronic device 30 is facing the lateral surface 10C3 of the protrusion portion 120 of the region 10C of the carrier 10. In some arrangements, the lateral surface of the optoelectronic device 30 may not contact the lateral surface 10C3 of the protrusion portion 120 of the region 10C of the carrier 10, leaving a gap therebetween. In some arrangements, the lateral surface of the optoelectronic device 30 may directly contact the lateral surface 10C3 of the protrusion portion 120 of the region 10C of the carrier 10.

In some arrangements, the optoelectronic device 30 includes an EIC component. In some arrangements, the optoelectronic device 30 (e.g., the EIC component) includes at least one TSV 32. In some arrangements, a height of the TSV 32 (i.e., the thickness of the optoelectronic device 30) may be from about 120 μm to about 180 μm, e.g., about 150 μm. The height of the TSV 32 and the thickness of the optoelectronic device 30 is measured across an axis normal to a surface of the optoelectronic device 30 or to the surface 10P1/102. In some arrangements, the optoelectronic device 30 includes an RDL 36 on a surface of the optoelectronic device 30 (facing the processing unit 20) and an RDL 38 on an opposite surface of the optoelectronic device 30 (facing the carrier 10). In some arrangements, the RDL 36 is electrically connected to the RDL 38 using the at least one TSV 32 of the optoelectronic device 30.

The optoelectronic device 40 may be disposed on the carrier 10 and in proximity to the protrusion portion 120 of the carrier 10. In some arrangements, the optoelectronic device 40 is disposed in the cavity 110 of the carrier 10. In some arrangements, the optoelectronic device 40 is spaced apart from the upper surface 10P1 of the region 10P of the carrier 10 by a gap G1. In some arrangements, the gap G1 is an air gap. According to some arrangements of the present disclosure, the gap G1 can provide a buffer or tolerance space for the volume changes of the optoelectronic device 40 and/or the carrier 10 resulted from thermal expansion. Therefore, undesirable separation or breakage between the optoelectronic device 30 and the optoelectronic device 40 can be prevented, deformation of the optoelectronic package 1 can be prevented, and thus the reliability of the optoelectronic package 1 can be improved.

In some arrangements, a lateral surface of the optoelectronic device 40 is facing the lateral surface 10C3 of the protrusion portion 120 of the region 10C of the carrier 10. In some arrangements, the lateral surface of the optoelectronic device 40 may not contact the lateral surface 10C3 of the protrusion portion 120 of the region 10C of the carrier 10, leaving a gap therebetween. In some arrangements, the lateral surface of the optoelectronic device 40 may directly contact the lateral surface 10C3 of the protrusion portion 120 of the region 10C of the carrier 10. In some arrangements, the optoelectronic device 40 includes a PIC component. In some arrangements, the EIC component (i.e. the optoelectronic device 30) is stacked on the PIC component (i.e. the optoelectronic device 40) along an axis normal to the surface 10P1, and the PIC component (i.e. the optoelectronic device 40) is adjacent to the carrier 10. In some arrangements, the optoelectronic device 30 is electrically connected to the optoelectronic device 40 using the at least one TSV 32 of the optoelectronic device 30. In some arrangements, an upper surface 41 of the optoelectronic device 40 has an elevation lower than that of the upper surface 10C1 of the region 10C of the carrier 10. In some arrangements, the optoelectronic device 40 includes an RDL 44 on the upper surface 41 of the optoelectronic device 40. The EIC component and the PIC component in combination may be referred to as a photonics engine or photonics device.

The optical components 42 may be optically coupled to the optoelectronic device 40. In some arrangements, the optical component 42 is optically coupled to a waveguide of the optoelectronic device 40 (e.g., the PIC component). In some arrangements, the optical component 42 is configured to transmit and/or receive optical signals. In some arrangements, as shown, an edge or corner of the optoelectronic device 40 defines a space or a recess configured to accommodate a shape of the optical component 42, where the optical component 42 is coupled to the edge or corner of the optoelectronic device 40. In some arrangements, the optical component 42 includes one or more optical fibers or laser diodes. In some arrangements, the optical component 42 includes an optical fiber array unit or an optical fiber array unit surrounded by a housing. In some arrangements, the optical components 42 may be located at an active surface of the optoelectronic device 40 (e.g., the PIC component). The active surface may refer to a surface which input/output (I/O) terminals are located at or proximal to. The active surface of the optoelectronic device 40 faces the optoelectronic device 30. In some arrangements, the optical components 42 may be located at a lateral surface of the optoelectronic device 40 facing away from the lateral surface 10C3 of the protrusion portion 120 of the carrier 10.

The conductive elements 50 may be between the carrier 10 and the processing unit 20. The conductive elements 50 may be disposed on the region 10C of the carrier 10. In some arrangements, the conductive elements 50 are in direct contact with the upper surface 10C1 of the carrier 10. In some arrangements, a size (e.g., a diameter or a width) of the conductive element 50 may be from about 60 μm to about 80 μm, e.g., about 70 μm. The width of the conductive element 50 is measured along an axis normal or parallel to the surface 10C1. In some arrangements, the thickness D1 of the conductive element 50 may be from about 70 μm to about 90 μm, e.g., about 80 μm. In some arrangements, the conductive elements 50 include conductive bumps.

The conductive elements 52 may be between the processing unit 20 and the optoelectronic devices 30 and 40. The conductive elements 52 may be disposed on the region 10P of the carrier 10. In some arrangements, the conductive elements 52 are in direct contact with the optoelectronic device 30. In some arrangements, the conductive bumps 52 are electrically connected to the optoelectronic device 30 using the RDL 36. In some arrangements, the conductive elements 52 include conductive bumps. In some arrangements, the underfill 53 covers or encapsulates the conductive elements 52. The underfill 53 can prevent oxidation and/or deterioration of the conductive elements 52, and thus improve the quality of electrical signal transmission. The underfill 53 may include an epoxy resin, a molding compound (e.g., an epoxy molding compound or other molding compound), polyimide, a phenolic compound or material, a material including a silicone dispersed therein, or a combination thereof.

In some arrangements, the power supply path from the carrier 10 to the processing unit 20 includes or passes through the conductive elements 50. The power supply path may be connected to a power voltage or signal or connected to a ground voltage or signal. For example, the power supply path may be connected to a ground voltage or signal of the carrier 10 or a PCB in some examples. In some examples, the power supply path may be connected to a power voltage or signal of a PCB for driving a component (e.g., the processing unit 20). In some arrangements, the electrical signal path from the processing unit 20 to the optoelectronic device 30 includes or passes through the conductive elements 52. In some arrangements, a pitch P1 of the conductive elements 50 is greater than a pitch P2 of the conductive elements 52. In some arrangements, the pitch P1 of the conductive elements 50 is greater than a pitch P3 of the conductive elements 54. The term "pitch" (e.g., the pitches P1, P2, and P3) may refer to a center-to-center distance between adjacent conductive elements. P1, P2, and P3 are defined along an axis parallel to the surface 10C1 or 10P1. In some arrangements, a size (e.g., a diameter or a width) of the conductive elements 50 is greater than a size of the conductive elements 52. The width of the conductive element 52 is measured along an axis normal or parallel to a surface of the RDL 60 or a surface of the RDL 36 on which the conductive element 52 is disposed. According to some arrangements, the conductive elements 50 for power supply has a relatively large size improves the stability of power supply as well as the reliability of the optoelectronic package 1.

The conductive elements 54 may be disposed between the optoelectronic device 30 and the optoelectronic device 40. In some arrangements, the conductive bumps 54 are electrically connected to the optoelectronic device 30 using the RDL 38. In some arrangements, the conductive bumps 54 are electrically connected to the optoelectronic device 40 using the RDL 44. In some arrangements, the RDL 38 is electrically connected to the RDL 44 using the conductive bumps 54. In some arrangements, the conductive elements 54 include conductive bumps. In some arrangements, the underfill 55 covers or encapsulates the conductive elements 54. The underfill 55 can prevent oxidation and/or deterioration of the conductive elements 54, and thus improves the quality of electrical signal transmission. The underfill 55 may include an epoxy resin, a molding compound (e.g., an epoxy molding compound or other molding compound), polyimide, a phenolic compound or material, a material including a silicone dispersed therein, or a combination thereof.

The RDL 60 may be between the carrier 10 and the processing unit 20. In some arrangements, the RDL 60 is between the processing unit 20 and the conductive elements 50. In some arrangements, the conductive elements 50 are between and in direct contact with the RDL 60 and the region 10C of the carrier 10. In some arrangements, the interconnection element (e.g., including or formed of the conductive element 50 and the RDL 60) that is electrically connecting the carrier 10 to the processing unit 20 is free from TSVs. In some arrangements, the power supply path from the carrier 10 to the processing unit 20 passes through the conductive element 50 and the RDL 60 is free from TSVs.

In some arrangements, the RDL 60 has a portion 61 electrically connected to the carrier 10 and a portion 62 electrically connected to the optoelectronic device 30. In some arrangements, the portion 61 is directly connected to the portion 62 of the RDL 60. In some arrangements, the protrusion portion 120 of the carrier 10 is electrically connected to the portion 61 of the RDL 60. In some arrangements, the conductive elements 50 are disposed on the portion 61 of the RDL 60 and in direct contact with the protrusion portion 120 of the carrier 10. In some arrangements, the processing unit 20 is electrically connected to the region 10C of the carrier 10 using the portion 61 of the RDL 60 and the conductive elements 50. In some arrangements, the conductive elements 52 are disposed on the portion 62 of the RDL 60 and in direct contact with the optoelectronic device 30. In some arrangements, the processing unit 20 is electrically connected to the optoelectronic device 30 using the portion 62 of the RDL 60 and the conductive elements 52.

In some arrangements, the processing unit 20 is covered by a dielectric structure 70 (e.g., an encapsulant). The dielectric structure 70 may at least partially encapsulate the processing unit 20. In some arrangements, the dielectric structure 70 directly or physically contacts the RDL 60. In some arrangements, the dielectric structure 70 may include an epoxy resin having fillers, a molding compound (e.g., an epoxy molding compound or other molding compound), polyimide, a phenolic compound or material, a material with a silicone dispersed therein, or a combination thereof. In some arrangements as illustrated in FIG. 1, the RDL 60 may be disposed at a lower surface of the dielectric structure 70 and a lower surface of the processing unit 20, where both lower surfaces face the carrier 10. In some arrangements, the processing unit 20 may be exposed from the dielectric structure 70, for example, by grinding or other suitable operations, for heat dissipation of the processing unit 20. In some arrangements, a heatsink or heat dissipation structure may be further disposed on the exposed portion of the processing unit 20 to enhance the heat dissipation of the processing unit 20. In some arrangements, the dielectric structure 70 may include a high-k material to reduce or prevent the electromagnetic interference to the processing unit 20 from external components.

The electrical contacts 90 may be disposed on the surface 102 of the carrier 10. The electrical contact 90 can provide electrical connections between the optoelectronic package 1 and external components (e.g., external circuits or circuit boards not shown). In some arrangements, the electrical contacts 90 are electrically connected to the conductive pads 130p of the carrier 10. In some arrangements, the electrical contacts 90 include solder balls. In some arrangements, the electrical contacts 90 include a ball grid array (BGA), or a land grid array (LGA).

In some cases where an ASIC is disposed on a substrate or an interposer including TSVs, the ASIC and photonics engines are both disposed on a PCB and electrically connected to each other using the PCB and the substrate (or the TSVs of the interposer). In such cases, the electrical path extending along a horizontal direction (parallel to a surface of the PCB) between the ASIC and the photonics engines may be relatively long, which hinders high speed transmission. For example, the transmitted signals may be distorted. To solve the aforesaid issues, the ASIC and the photonics engines may be disposed on the same substrate or interposer which is connected to a PCB disposed underneath, and the ASIC and the photonics engines may be arranged side-by-side and electrically connected to each other using the substrate or interposer. With such arrangement, the electrical path along a horizontal direction between the ASIC and the photonics engines may be shortened. However, a relatively large device area (i.e., a relatively large surface area of the substrate or interposer for accommodating the devices, such as ASIC and the photonics engines) is required due to the 2D arrangement (e.g., arranged side-by-side) of the ASIC and the photonics engines, which may result in decrease in manufacturing yield. In addition, in the cases where an interposer including TSVs is used, the power supply path from the PCB to the ASIC that passes through the TSVs of the interposer is relatively long.

According to some arrangements of the present disclosure, the processing unit 20 is electrically connected to a power supply path that connects to the region 10C of the carrier 10, and the power supply path is free from (i.e., without) TSVs. The carrier 10 can supply power directly to the processing unit 20 by virtue of the protrusion portion 120 of the region 10C without passing through any TSVs, and thus the power supply path can be significantly shortened. With the power supply path being reduced, thermal accumulation during the power supplying operation can be shortened as well, and thus the electrical signal integrity can be improved. Moreover, according to some arrangements of the present disclosure, the power supply path includes the conductive bumps 50 and the RDL 60 instead of bonding wires. Accordingly, the inductive effects which could have been caused by relatively long bonding wires can be prevented, and the signal integrity can be improved. In that regard, high-speed transmission can be improved.

In addition, according to some arrangements of the present disclosure, the processing unit 20 is stacked over the optoelectronic devices 30 and 40. Thus, the electrical path extending along a vertical direction (a direction normal to the surface 10C1 or 10P1) between the processing unit 20 and the optoelectronic device 30 can be shortened. Moreover, according to some arrangements of the present disclosure, while the stacked structure reduces the device area and thus reduces the size of the carrier 10 (e.g., less than about 10×10 $cm^2$) and increases yield, the optoelectronic devices 30 and 40 are embedded in the cavity 110 of the carrier 10, and thus further reducing the thickness of the stacked structure. This serves to reduce the size of the entire optoelectronic package 1.

Furthermore, according to some arrangements of the present disclosure, the processing unit 20 is disposed at (aligned in the vertical direction with) the region 10C of the carrier 10 (e.g., on the upper surface 10C1 of the protrusion portion 120) to receive power from the carrier 10, and the optoelectronic devices 30 and 40 are disposed at (aligned in the vertical direction with) the region 10P of the carrier 10 (e.g., in the cavity 110) and partially overlap the processing unit 20 from a top view perspective (along an axis normal to the surface 10C1 or 10P1). As a result, the device area can be reduced, the surface area of the carrier 10 needed for accommodating the devices (e.g., ASIC and optoelectronic devices 30 and 40) can be reduced, the size of the carrier 10 can be reduced, and the manufacturing yield can be increased.

Figure 2A:
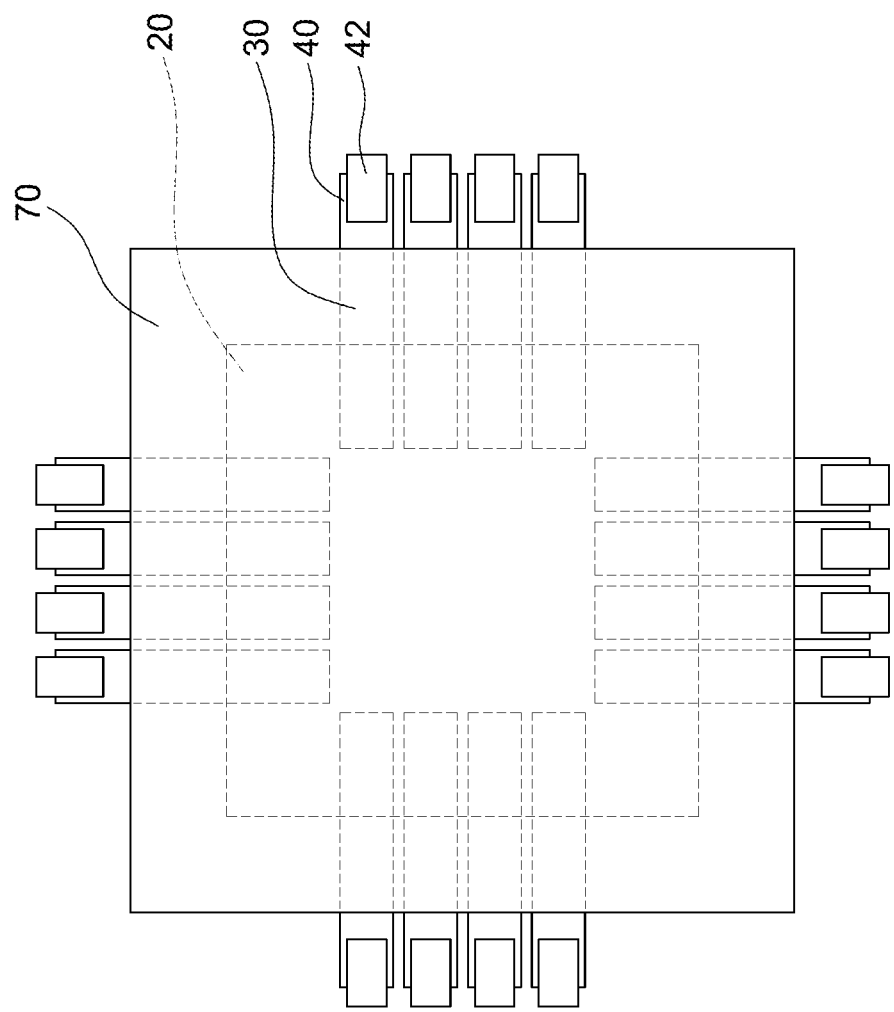
FIG. 2A illustrates a top view of a portion of an optoelectronic package in accordance with some arrangements of the present disclosure.

FIG. 2A illustrates a top view of a portion of an optoelectronic package 1 in accordance with some arrangements of the present disclosure. In some arrangements, FIG. 2A illustrates a top view of the arrangement of the processing unit 20, the optoelectronic devices 30 and 40, the dielectric structure 70, and the optical components 42. It should be noted that some components are omitted in FIG. 2A for clarity.

In some arrangements, the optoelectronic devices 30 are at least partially covered by the dielectric structure 70 from a top view perspective. In some arrangements, the optoelectronic devices 30 and 40 are disposed under a peripheral region of the processing unit 20. In some arrangements, the optoelectronic devices 30 and 40 surround a central region of the processing unit 20 from a top view perspective. The peripheral region of the processing unit 20 surrounds the central region. In some arrangements, the optical components 42 are spaced apart from the dielectric structure 70 with a gap therebetween.

Figure 2B:
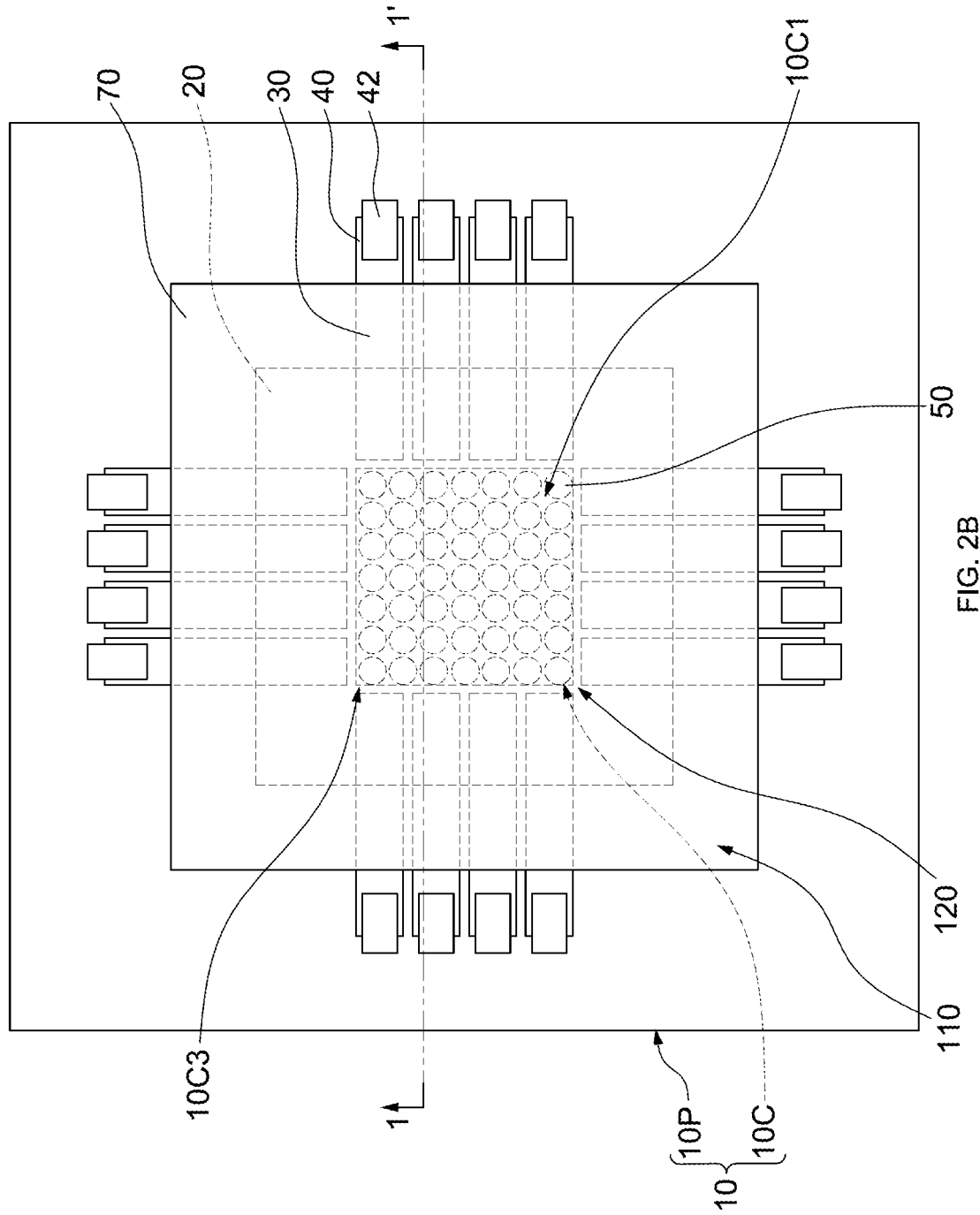
FIG. 2B illustrates a top view of an optoelectronic package in accordance with some arrangements of the present disclosure.

FIG. 2B illustrates a top view of an optoelectronic package in accordance 1 with some arrangements of the present disclosure. In some arrangements, FIG. 1 illustrates a cross-sectional view along the cross-sectional line 1-1' in FIG. 2B. It should be noted that some components are omitted in FIG. 2B for clarity.

In some arrangements, the processing unit 20 covers the region 10C of the carrier 10 from a top view perspective. In some arrangements, the cavity 110 is around the upper surface 10C1 of the carrier 10 from a top view perspective. In some arrangements, the cavity 110 surrounds the upper surface 10C1 of the carrier 10 from a top view perspective. In some arrangements, the cavity 110 surrounds the protrusion portion 120 of the carrier 10 from a top view perspective. The edges or boundaries of the upper surface 10C1 or the protrusion portion 120 define edges or boundaries of the cavity 110. In some arrangements, the optoelectronic components 30 and 40 are accommodated in the cavity 110 and surrounding the region 10C or the protrusion portion 120 of the carrier 10 from a top view perspective.

Figure 3A:
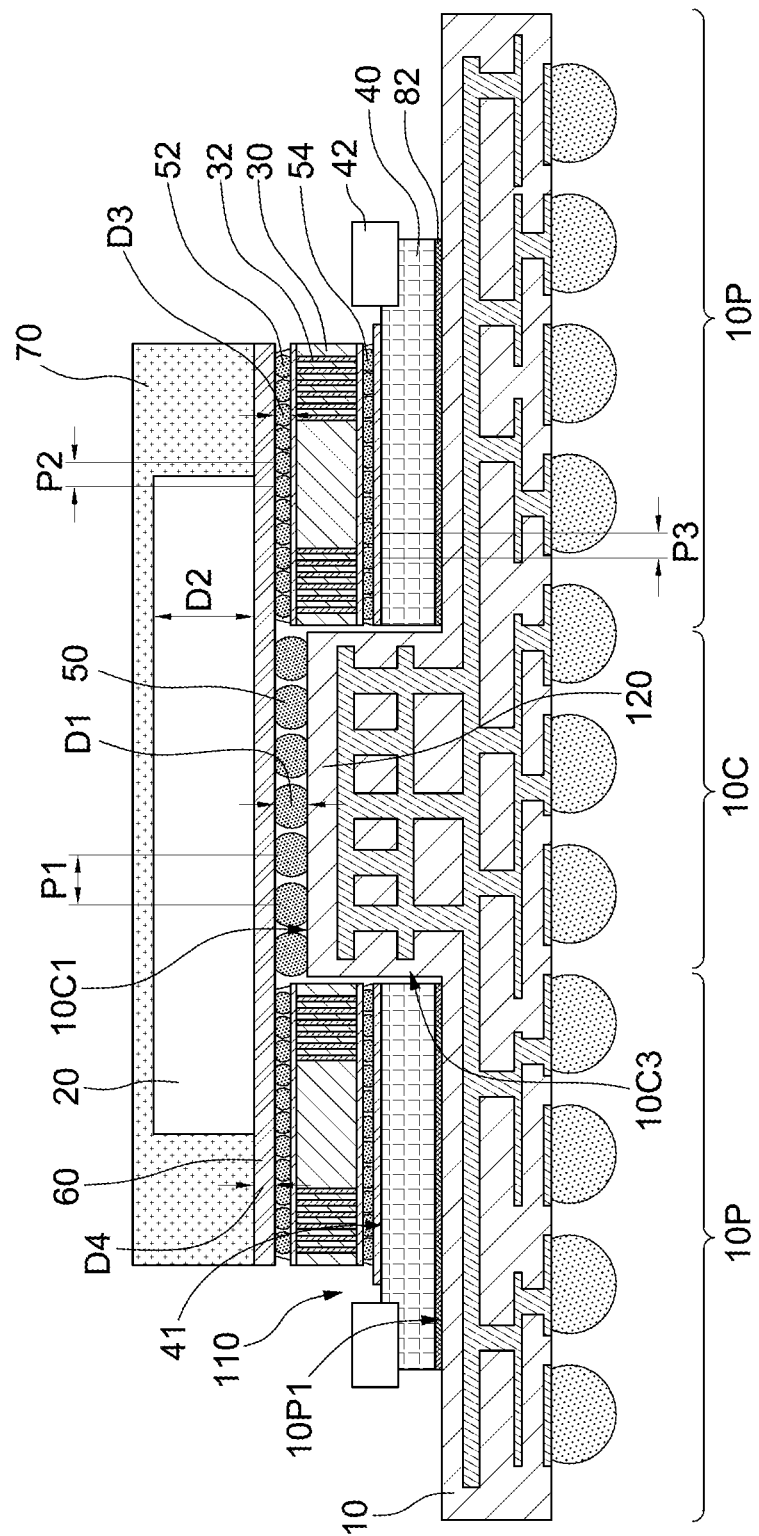
FIG. 3A illustrates a cross-sectional view of an optoelectronic package in accordance with some arrangements of the present disclosure.

FIG. 3A illustrates a cross-sectional view of an optoelectronic package 3A in accordance with some arrangements of the present disclosure. The optoelectronic package 3A is similar to the optoelectronic package 1 in FIG. 1, and the differences therebetween are described as follows.

In some arrangements, the optoelectronic package 3A further includes an adhesive layer 82 between the optoelectronic device 40 and the upper surface 10P1 of the region 10P of the carrier 10. In some arrangements, the adhesive layer 82 directly contacts the optoelectronic device 40 and the upper surface 10P1 of the region 10P of the carrier 10. In some arrangements, the adhesive layer 82 is spaced apart from the lateral surface 10C3 of the protrusion portion 120. In some arrangements, the adhesive layer 82 is a flexible adhesive layer. According to some arrangements of the present disclosure, the adhesive layer 82 can fasten or fix the optoelectronic device 40 to the carrier 10, and the flexibility of the adhesive layer 82 provides a buffer or tolerance between the optoelectronic device 40 to the carrier 10. Therefore, undesirable separation or breakage between the optoelectronic device 30 and the optoelectronic device 40 due to volume changes resulted from thermal expansion can be prevented, deformation of the optoelectronic package 1 can be prevented, and thus the reliability of the optoelectronic package 1 can be improved.

Figure 3B:
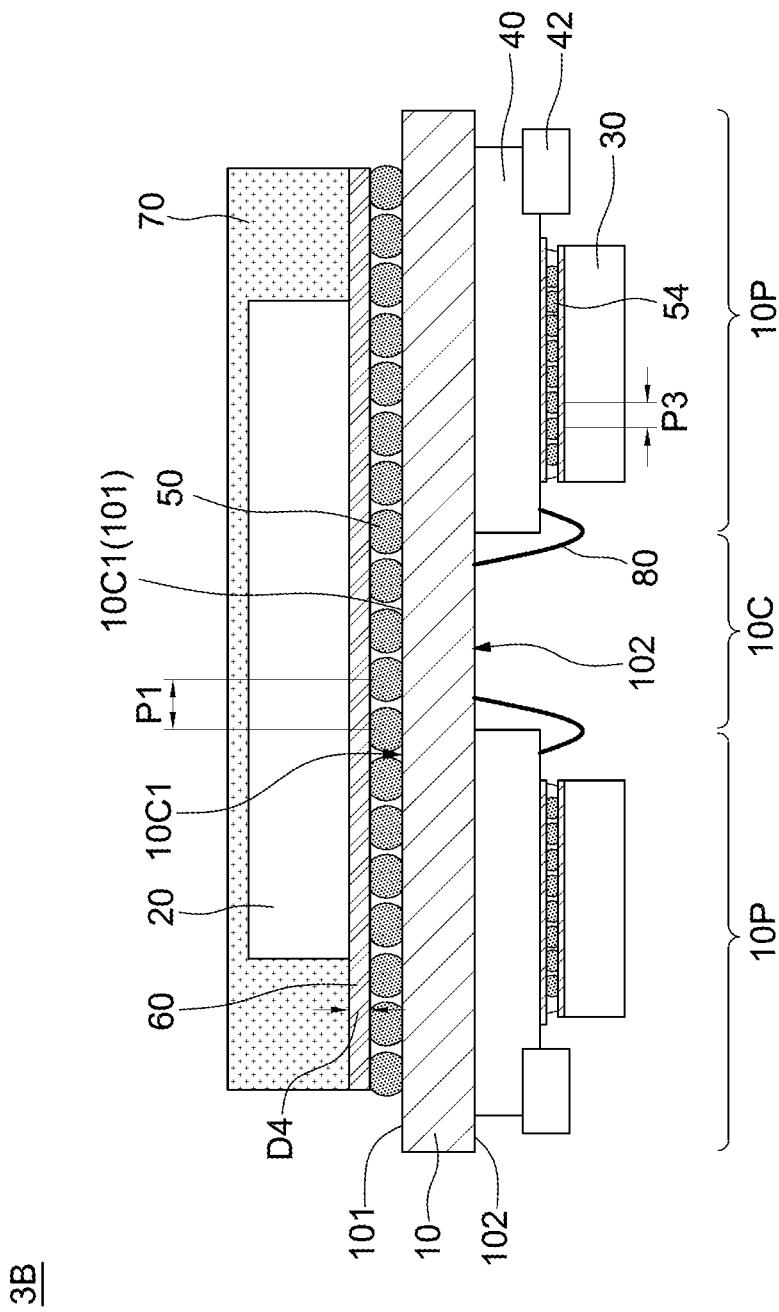
FIG. 3B illustrates a cross-sectional view of an optoelectronic package in accordance with some arrangements of the present disclosure.

FIG. 3B illustrates a cross-sectional view of an optoelectronic package 3B in accordance with some arrangements of the present disclosure. The optoelectronic package 3B is similar to the optoelectronic package 1 in FIG. 1, and the differences therebetween are described as follows.

In some arrangements, the processing unit 20 is located at one surface of the carrier 10 and the optoelectronic devices 30 and 40 are located at an opposite surface of the carrier 10. In some arrangements, the processing unit 20 is disposed on an upper surface 101 of the carrier 10, and the optoelectronic devices 30 and 40 are disposed on a bottom surface 102 of the carrier 10. In some arrangements, the optoelectronic device 40 is electrically connected to the surface 102 of the carrier 10 using a bonding wire 80.

In some arrangements, an interconnection element including the conductive elements 50 and the RDL 60 is located between the processing unit 20 and at least a portion (e.g., the surface 10C1) of the upper surface 101 of the carrier 10, and the power is supplied to the processing unit 20 using the interconnection element.

FIG. 4A, FIG. 4B, FIG. 4C, FIG. 4D, FIG. 4E, FIG. 4F, FIG. 4G, and FIG. 4H illustrate various operations in a method of manufacturing an optoelectronic package 1 in accordance with some arrangements of the present disclosure.

Referring to FIG. 4A, an optoelectronic device 30 may be provided. In some arrangements, the optoelectronic device 30 includes an EIC component.

Referring to FIG. 4B, at least one TSV 32 may be formed within the optoelectronic device 30, and RDLs 36 and 38 may be formed on an upper surface 30a and a bottom surface 30b of the optoelectronic device 30, respectively. In some arrangements, the TSV 32 passes from the upper surface 30a to the bottom surface 30b of the optoelectronic device 30.

Referring to FIG. 4C, an optoelectronic device 40 may be provided, and an RDL 44 may be formed on a portion of an upper surface 41 of the optoelectronic device 40. In some arrangements, the optoelectronic device 40 includes a PIC component.

Referring to FIG. 4D, the optoelectronic device 30 may be electrically connected to the optoelectronic device 40 using conductive bumps 54. In some arrangements, an underfill 55 may be formed to cover or encapsulate the conductive bumps 54.

Figure 4E:
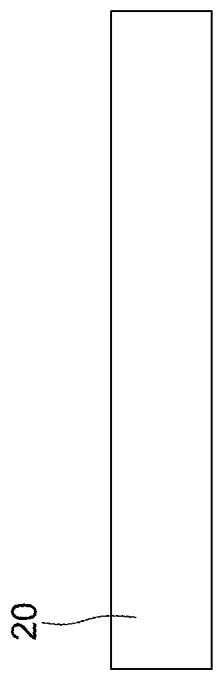

Referring to FIG. 4E, a processing unit 20 may be provided. In some arrangements, the processing unit 20 includes a CPU, a MCU, a GPU, an ASIC, a SRAM, or a combination thereof.

Figure 4F:
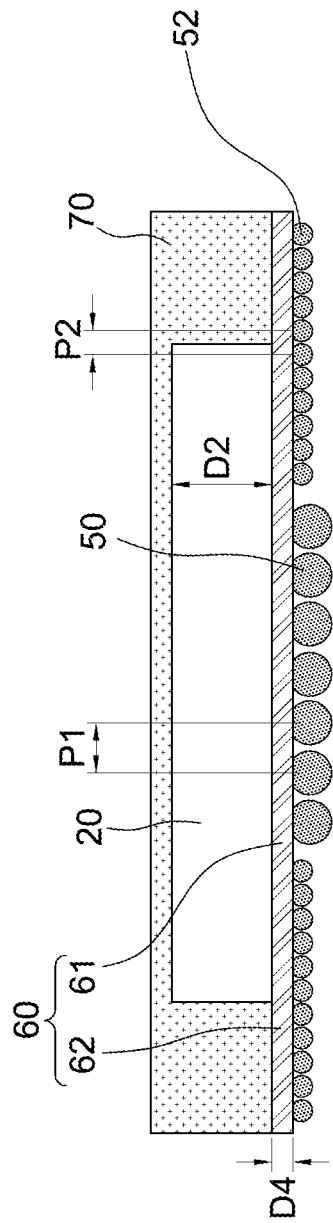

Referring to FIG. 4F, a dielectric structure 70 may be formed to cover or encapsulate at least a part of the processing unit 20. An RDL 60 may be formed on the processing unit 20 and the dielectric structure 70. A plurality of conductive bumps 50 and 52 may be disposed on the RDL 60. In some arrangements, the conductive bumps 50 are disposed on a portion 61 (also referred to as "a central portion") of the RDL 60, and the conductive bumps 52 are disposed on a portion 62 (also referred to as "a peripheral portion") of the RDL 60. In some arrangements, a pitch P1 of the conductive bumps 50 is greater than a pitch P2 of the conductive bumps 52. In some arrangements, a size (width or diameter) of the conductive bumps 50 is greater than a size (width or diameter) of the conductive bumps 52.

Figure 4G:
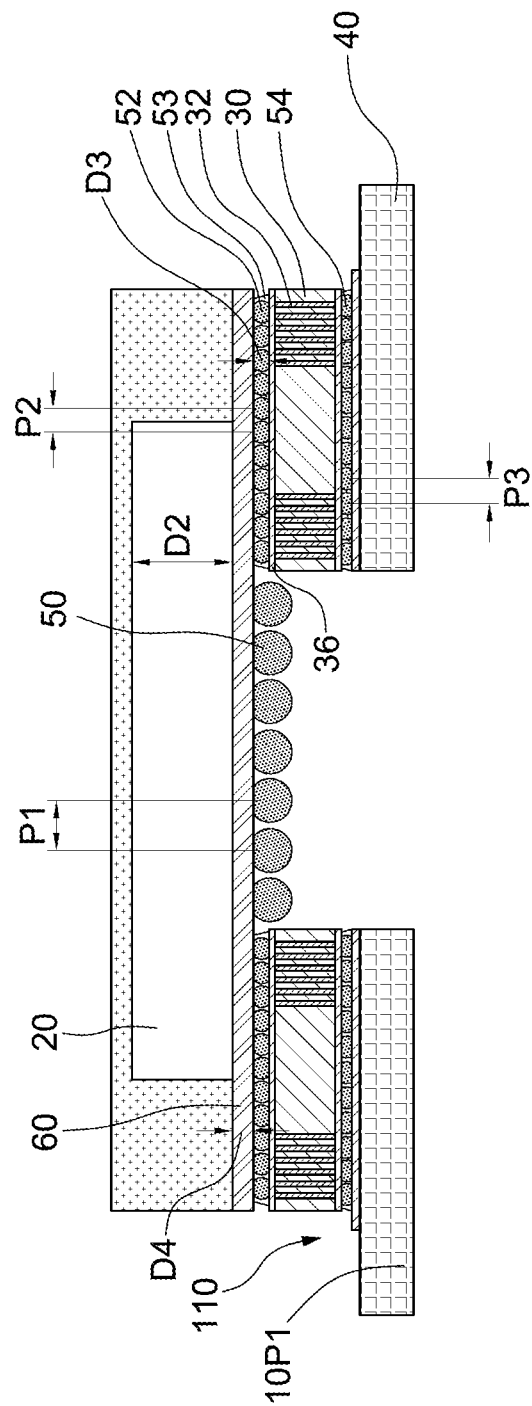

Referring to FIG. 4G, the processing unit 20 may be electrically connected to the optoelectronic device 30. In some arrangements, the optoelectronic device 30 is electrically connected to the processing unit 20 using the conductive bumps 52. In some arrangements, the RDL 36 is electrically connected to the portion 62 of the RDL 60 using the conductive bumps 52. In some arrangements, an underfill 53 is formed to cover or encapsulate the conductive bumps 52.

Figure 4H:
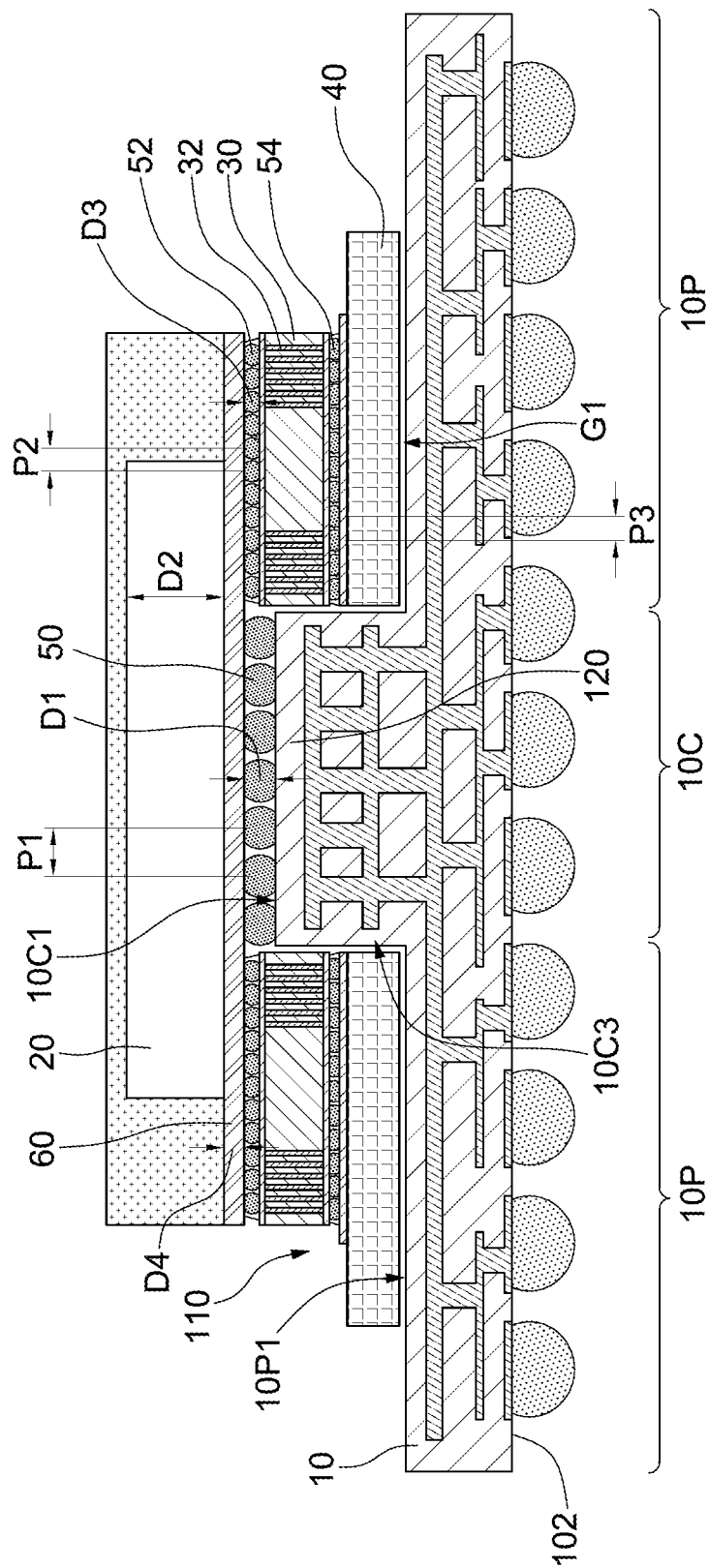

Referring to FIG. 4H, a carrier 10 including a region 10C and a region 10P may be provided, the processing unit 20 may be electrically connected to the region 10C of the carrier 10, and the optoelectronic devices 30 and 40 may be disposed over the region 10P of the carrier 10. In some arrangements, the processing unit 20 is electrically connected to the region 10C of the carrier 10 using the conductive bumps 50. In some arrangements, the optoelectronic device 40 is spaced apart from the region 10P of the carrier 10 by a gap G1. In some arrangements, electrically connecting the processing unit 20 to the region 10C of the carrier 10 and disposing the optoelectronic devices 30 and 40 over the region 10P of the carrier 10 are performed in the same operation. In some arrangements, electrical contacts 90 may be disposed on the surface 102 of the carrier 10.

Referring to FIG. 1, an optical component 42 may be disposed to optically couple to the optoelectronic device 40. In some arrangements, an edge of the optoelectronic device 40 defines a space or a recess configured to accommodate the optical component 42. In some arrangements, the optical component 42 includes an optical fiber array unit or an optical fiber array unit surrounded by a housing. As such, the optoelectronic package 1 illustrated in FIG. 1 is formed.

Figure 5A:
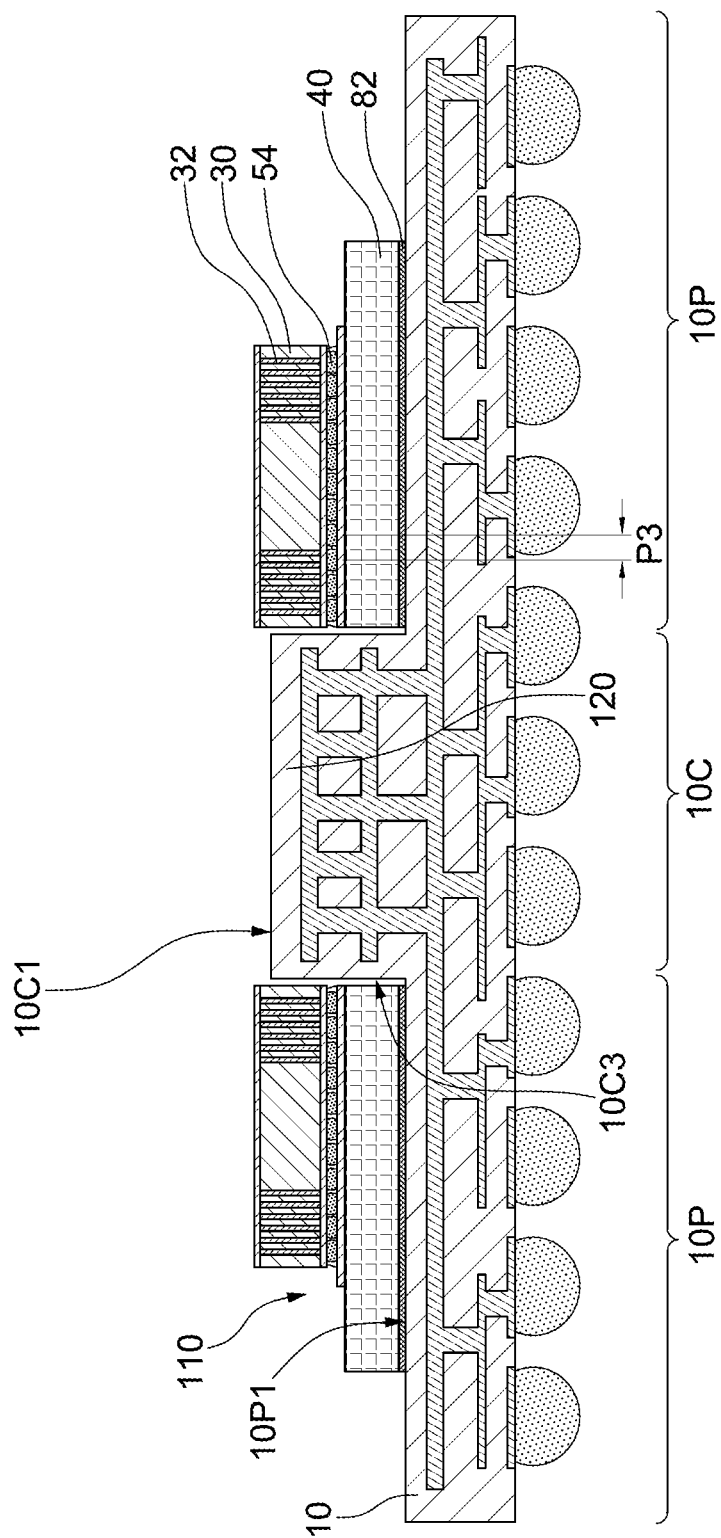
FIG. 5A and FIG. 5B illustrate various operations in a method of manufacturing an optoelectronic package in accordance with some arrangements of the present disclosure.
Figure 5B:
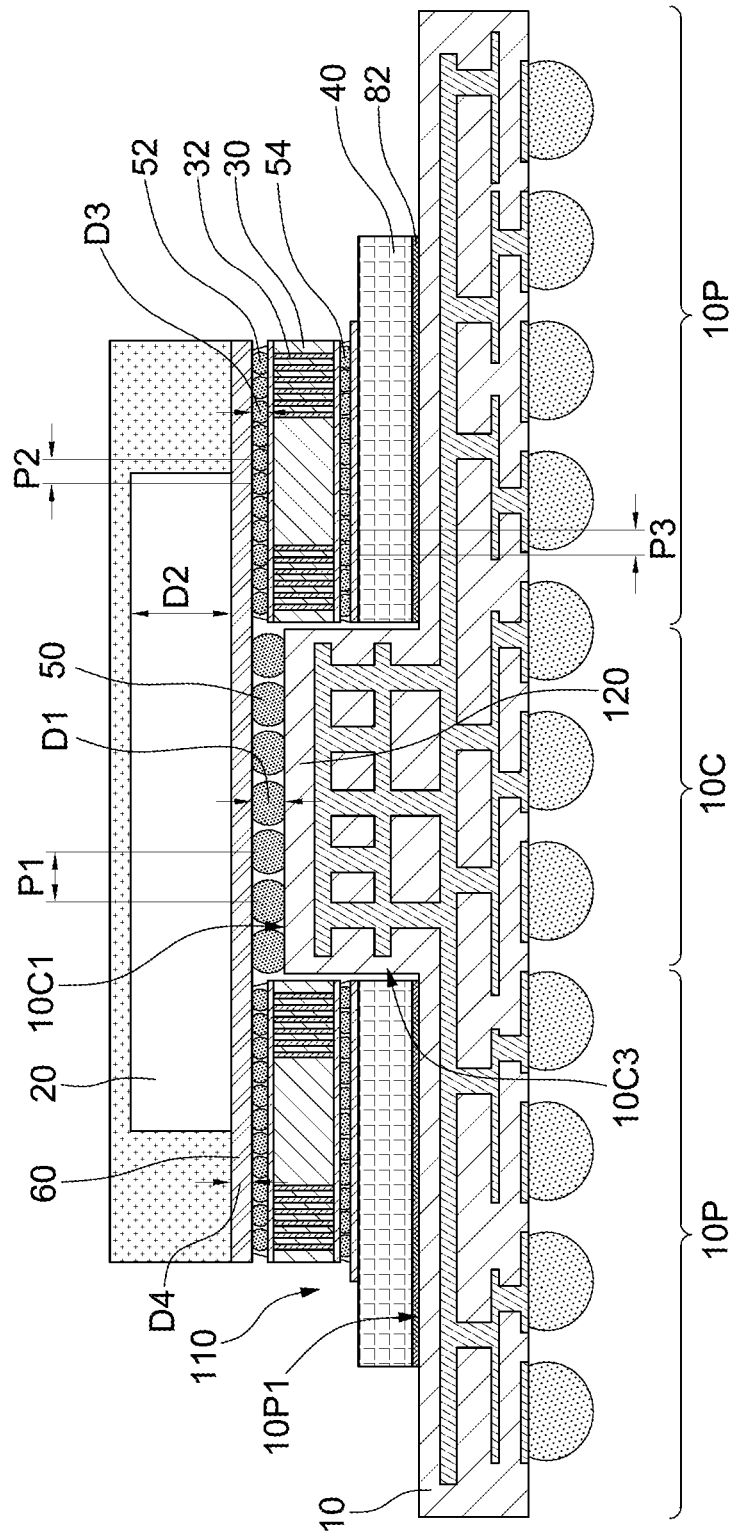

FIG. 5A and FIG. 5B illustrate various operations in a method of manufacturing an optoelectronic package 3A in accordance with some arrangements of the present disclosure.

Referring to FIG. 5A, a carrier 10 including a region 10C and a region 10P may be provided, operations similar to those illustrated in FIGS. 4A-4D may be performed to form a structure including an optoelectronic device 30 electrically connected to an optoelectronic device 40 using conductive bumps 54, and the optoelectronic device 40 may be adhered to the region 10P of the carrier 10 using an adhesive layer 82. In some arrangements, electrical contacts 90 may be disposed on the surface 102 of the carrier 10.

Referring to FIG. 5B, operations similar to those illustrated in FIG. 4E and FIG. 4F may be performed to form a structure including a processing unit 20 covered or encapsulated by a dielectric structure 70 processing unit 20, an RDL 60 formed on the processing unit 20 and the dielectric structure 70, and conductive bumps 50 and 52 formed on the RDL 60, and such structure may electrically connected to region 10C of the carrier 10 and the optoelectronic device 30 using the conductive bumps 50 and 52, respectively.

Referring to FIG. 3A, an optical component 42 may be disposed to optically couple to the optoelectronic device 40. In some arrangements, an edge of the optoelectronic device 40 defines a space or a recess configured to accommodate the optical component 42. In some arrangements, the optical component 42 includes an optical fiber array unit or an optical fiber array unit surrounded by a housing. As such, the optoelectronic package 1 illustrated in FIG. 3A is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some arrangements, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific arrangements thereof, these descriptions and illustrations do not limit the present disclosure. It can be clearly understood by those skilled in the art that various changes may be made, and equivalent components may be substituted within the arrangements without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other arrangements of the present disclosure that are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optoelectronic package, comprising:
    a carrier, comprising:
        a first region configured to supply power to a processing unit disposed on the carrier; and
        a second region for accommodating an optoelectronic device electrically coupled to the processing unit;
    wherein the optoelectronic device comprises a photonic integrated circuit (PIC) component and an electronic integrated circuit (EIC) component stacked between a bottom surface of the processing unit and a topmost surface of the PIC component, and the processing unit vertically partially overlaps the PIC component; and wherein the PIC component has a first lateral side facing toward the first region of the carrier and vertically overlapping the processing unit.

2. An optoelectronic package, comprising:
a substrate;
a processing unit electrically connected to the substrate;
two PIC components;
an EIC component stacked over at least one of the PIC components; and
a first redistribution layer (RDL) between the EIC component and at least one of the PIC components;
wherein the processing unit, the PIC components, and the EIC component are spaced apart from each other, and the processing unit comprises an integrated circuit (IC) vertically overlapping the two PIC components.

3. The optoelectronic package of claim 1, wherein the EIC component has a second lateral side facing toward the first region of the carrier and substantially vertically aligned with the first lateral side of the PIC component.

4. The optoelectronic package of claim 1, wherein a bottom surface of the PIC component is electrically non-connected to the second region of the carrier.

5. The optoelectronic package of claim 1, further comprising an adhesive layer adhering the PIC component to the second region of the carrier.

6. The optoelectronic package of claim 5, wherein the adhesive layer is spaced apart from a lateral surface of the first region of the carrier.

7. The optoelectronic package of claim 1, wherein the PIC component is entirely within an area defined by extending lines of two opposite edges of the processing unit in a top view perspective.

8. The optoelectronic package of claim 2, wherein a lateral surface of the first RDL is recessed with respect to a lateral surface of the at least one of PIC components.

9. The optoelectronic package of claim 2, wherein a lateral surface of the first RDL is protruded with respect to a lateral surface of the EIC component.

10. The optoelectronic package of claim 2, further comprising:
a conductive element between the substrate and the processing unit; and
a second RDL between the conductive element and the processing unit, wherein a lateral edge of the second RDL is misaligned with a lateral edge of the first RDL.

11. The optoelectronic package of claim 2, further comprising an optical component optically coupled to at least one of the PIC components, wherein an elevation of a top surface of the optical component is between an elevation of a top surface and an elevation of a bottom surface of the EIC component.

12. An optoelectronic package, comprising:
a substrate;
a processing unit electrically connected to the substrate;
two PIC components; and
an EIC component stacked over at least one of the PIC components;
wherein the processing unit, the PIC components, and the EIC component are spaced apart from each other, and the processing unit comprises an integrated circuit (IC) vertically overlapping the two PIC components; and
wherein a gap between the substrate and at least one of the PIC components is smaller than a gap between the EIC component and the at least one of PIC components.

* * * * *